United States Patent
Kudo et al.

(10) Patent No.: US 6,984,989 B2
(45) Date of Patent: Jan. 10, 2006

(54) CURRENT SENSOR AND OVERLOAD CURRENT PROTECTIVE DEVICE THEREWITH

(75) Inventors: Takahiro Kudo, Kanagawa (JP); Yujiro Kitaide, Kanagawa (JP); Kimitada Ishikawa, Saitama (JP)

(73) Assignee: Fuji Electric Co., Ltd., Kawasaki (JP)

( * ) Notice: Subject to any disclaimer, the term of this patent is extended or adjusted under 35 U.S.C. 154(b) by 0 days.

(21) Appl. No.: 10/468,317

(22) PCT Filed: Feb. 14, 2002

(86) PCT No.: PCT/JP02/01239

§ 371 (c)(1),
(2), (4) Date: Dec. 19, 2003

(87) PCT Pub. No.: WO02/065143

PCT Pub. Date: Aug. 22, 2002

(65) Prior Publication Data

US 2004/0095126 A1 May 20, 2004

(30) Foreign Application Priority Data

Feb. 16, 2001 (JP) .................................. 2001-040268
Mar. 29, 2001 (JP) .................................. 2001-097090

(51) Int. Cl.
*G01R 31/28* (2006.01)

(52) U.S. Cl. ............ 324/529; 324/117 R; 324/207.13; 351/44; 351/87; 351/115

(58) Field of Classification Search ............ 324/117 R, 324/117 H, 207.13, 524–530; 361/44, 87, 361/115
See application file for complete search history.

(56) References Cited

U.S. PATENT DOCUMENTS

| 3,571,656 A | * | 3/1971 | Paine et al. .................. 361/100 |
| 4,425,596 A | | 1/1984 | Satou ......................... 361/93.6 |
| 4,716,366 A | | 12/1987 | Hosoe et al. .......... 324/207.12 |
| 6,479,990 B2 | * | 11/2002 | Mednikov et al. .......... 324/225 |

FOREIGN PATENT DOCUMENTS

| EP | 0 989 411 | 3/2000 |
| EP | 1 037 056 | 9/2000 |
| JP | 3065661 | 3/1991 |
| JP | 6347489 | 12/1994 |
| JP | 09178707 | 12/1995 |
| JP | 2000-284029 | 10/2000 |

* cited by examiner

*Primary Examiner*—Vincent Q. Nguyen
(74) *Attorney, Agent, or Firm*—Greer, Burns & Crain, Ltd

(57) ABSTRACT

A small, low-cost, wide-range current sensor excellent in environmental resistance and noise resistance and high in accuracy, and an application device, a DC magnetic field is applied to two magnetic elements (1a, 1b) having a magnetic impedance effect by means of a magnet (3), while a negative feedback magnetic field is applied to both elements by means of a coil (2). The variation of the magnetic field depending on the external magnetic field applied to the magnetic elements (1a, 1b) is detected by detection units (7a, 7b). The difference between the output is amplified by a differential amplifier unit (8). Thus, detection is achieved in a wide range while eliminating the influence of the noise.

22 Claims, 11 Drawing Sheets

(a)

(b)

CURRENT SENSOR AND OVERLOAD CURRENT PROTECTIVE DEVICE THEREWITH

TECHNICAL FIELD

The present invention relates to a current sensor using a magnetic element having a magnetic impedance effect, and an overload current protective device for use with the current sensor.

BACKGROUND ART

Conventionally, a current transformer has been widely used as a current sensor, but its low sensitivity requires a laminated iron core, and the iron core generates magnetic saturation, thereby causing the problem of an insufficient current detection range. The iron core also causes the problem of a large sensor unit.

On the other hand, there is a method in which a Hall element and a magnetoresistive element are used as current detection elements. However, since they are low in detection sensitivity, the sensitivity is commonly improved by providing a magnet gathering core and a Hall element or a magnetic element mounted at the gain of the magnet gathering core.

Like the current transformer, the above-mentioned method of using the magnet gathering core uses a core of at least 3~4 cm and requires a large sensor unit, and generates the magnetic saturation by the iron core, thereby obtaining an insufficient current detection range. Furthermore, since the Hall element and the magnetoresistive element have large output fluctuations depending on the temperature, a temperature compensating circuit is required.

A high-sensitive magnetic detection element for replacing the Hall element and the magnetoresistive element can be, for example, a magnetic impedance element of an amorphous wire disclosed by Japanese Patent Application Laid-open No. Hei 6-347489, and a thin film disclosed by Japanese Patent Application Laid-open No. Hei 8-73835.

A magnetic impedance element of any shape indicates a high-sensitive magnetic detection characteristic, but the magnetic impedance element of an element itself has non-linearity like the example of the magnetic impedance characteristic by the amorphous wire shown in FIG. 10. By adding the bias magnetic field, the linearity of the dependence on the magnetic field to which an impedance variation is applied is improved (Japanese Patent Application Laid-open No. Hei 6-176930), a negative feedback coil is wound around the magnetic impedance element, a current proportional to the voltages on both ends of the magnetic impedance element is applied to the coil, and a negative feedback is provided, thereby obtaining an element excellent in linearity (Japanese Patent Application Laid-open No. Hei 6-347489).

The above-mentioned bias magnetic field is normally obtained by applying power to the coil wound around. However, in this case, two types of coils, that is, a bias coil and a feedback coil, are required, thereby upsizing the entire system.

Furthermore, using a wire type or a thin film type magnetic impedance element, there is the problem of variable element sensitivity depending on the material (magnetic permeability, resistivity, etc.) used when a magnetic impedance element is produced and the variance in element size (length, film thickness, film width, etc.).

FIG. 11 shows a common example of a detection circuit of the magnetic impedance element.

The detection circuit obtains impedance of a magnetic impedance element 1 by outputting through the detection circuit A and the amplification circuit B the output obtained when a high frequency current passes from a high frequency current generator (OSC) 4 to the magnetic impedance element 1. At this time, the output is adjusted by a variable resistor VR.

However, to reduce the variance in element sensitivity in the circuit, it is necessary to adjust and correct each system, thereby requiring a larger cost. Although each system can be adjusted and corrected, an automatic correction cannot be made. Therefore, the output of a device varies with time depending on the variations in temperature, etc., thereby causing the problem that high precision compensation cannot be realized.

Accordingly, the object of the present invention is to measure a wide current range with high precision using a small and low-cost system without reducing the precision by an environmental feature or with time.

DISCLOSURE OF INVENTION

To solve the above-mentioned problems, one embodiment of the invention includes: two magnetic detection elements which has a magnetic impedance effect and is provided near the wiring leading a current; a current applying unit for applying an alternating current to both ends of the magnetic detection element; a DC bias magnetic field applying unit for applying a DC bias magnetic field to the magnetic detection element; two detection units for detecting the variations in magnetic field by a current from the variations in alternating current varying depending on an external magnetic field applied to the magnetic detection element corresponding to the magnetic detection element; a differential amplification unit for differentiation amplifying the output of the two detection units; and a negative feedback magnetic field applying unit for applying a predetermined negative feedback magnetic field to the magnetic detection element depending on the output of the detection unit or the differential amplification unit.

Another embodiment of the invention includes: two magnetic detection elements which has a magnetic impedance effect and is provided near the wiring leading a current; a current applying unit for applying an alternating current to both ends of the magnetic detection element; a DC bias magnetic field applying unit for applying a DC bias magnetic field to the magnetic detection element; a negative feedback magnetic field applying unit for applying a negative feedback magnetic field to the magnetic detection element; a predetermined magnetic field applying unit for applying a predetermined magnetic field to the magnetic detection element; a switch unit for applying one of the negative feedback magnetic field and the predetermined magnetic field to the magnetic detection element; two detection units for detecting the variations in magnetic field by a current from the variations in alternating current varying depending on an external magnetic field applied to the magnetic detection element corresponding to the magnetic detection element; and a differential amplification unit for differentiation amplifying the output of the two detection units, characterized in that, depending on the output of the detection unit or the output of the differential amplification unit, a negative feedback magnetic field is applied to two magnetic detection elements in a period, a predetermined magnetic field is applied to two magnetic detection elements in another period, and a predetermined amendment is made to the output of the differential amplification unit depending on the output of the detection unit or the output of the differential amplification unit of each period.

In the inventions as previously discussed, the negative feedback magnetic field applying unit can be configured by a negative feedback coil provided near the magnetic detection element and a negative feedback element.

In another embodiment of the invention, two magnetic detection elements which has a magnetic impedance effect and is provided near the wiring leading a current; a current applying unit for applying an alternating current to both ends of the magnetic detection element; a DC bias magnetic field applying unit for applying a DC bias magnetic field to the magnetic detection element; a negative feedback coil for applying a negative feedback magnetic field to the magnetic detection element and a plurality of negative feedback elements; a switch unit for switching the plurality of negative feedback elements; two detection units for detecting the variations in magnetic field by a current from the variations in alternating current varying depending on an external magnetic field applied to the magnetic detection element corresponding to the magnetic detection element; and a differential amplification unit for differentiation amplifying the output of the two detection units, characterized in that, depending on the output of the detection unit or the output of the differential amplification unit, the plurality of negative feedback elements are selected.

In any of the inventions previously discussed, the DC bias magnetic field can be applied by a magnet provided near the magnetic detection element, a non-magnetic substrate can be provided with two magnetic detection elements of thin ferromagnet film, and the magnet for applying the DC bias magnetic field and the negative feedback coil for applying the negative feedback magnetic field are formed by thin film.

In any of the inventions previously discussed, the two magnetic detection elements can be arranged such that they can have equal absolute values of the output to the magnetic flux generated by a current, and have opposite polarity.

In another embodiment of the invention, in an overload current protective device, which is provided with a switch for supplying a current from a power source to a load or cutting it off, a current detector for detecting the current, and a control power source for providing power to each unit of the device, for cutting off the current to the load when an overcurrent occurs, the current detector is configured by two magnetic detection elements which has a magnetic impedance effect and is provided near the wiring leading a current; a current applying unit for applying an alternating current to both ends of the magnetic detection element; a DC bias magnetic field applying unit for applying a DC bias magnetic field to the magnetic detection element; two detection units for detecting the variations in magnetic field by a current from the variations in alternating current varying depending on an external magnetic field applied to the magnetic detection element corresponding to the magnetic detection element; and a differential amplification unit for differentiation amplifying the output of the two detection units; a negative feedback magnetic field applying unit for applying a predetermined negative feedback magnetic field to the magnetic detection element depending on the output of the detection unit or the differential amplification unit.

In another embodiment of the invention, in an overload current protective device, which is provided with a switch for supplying a current from a power source to a load or cutting it off, a current detector for detecting the current, and a control power source for providing power to each unit of the device, for cutting off the current to the load when an overcurrent occurs, two magnetic detection elements which has a magnetic impedance effect and is provided near the wiring leading a current; a current applying unit for applying an alternating current to both ends of the magnetic detection element; a DC bias magnetic field applying unit for applying a DC bias magnetic field to the magnetic detection element; a negative feedback magnetic field applying unit for applying a negative feedback magnetic field to the magnetic detection element; a predetermined magnetic field applying unit for applying a predetermined magnetic field to the magnetic detection element; a switch unit for applying one of the negative feedback magnetic field and the predetermined magnetic field to the magnetic detection element; two detection units for detecting the variations in magnetic field by a current from the variations in alternating current varying depending on an external magnetic field applied to the magnetic detection element corresponding to the magnetic detection element; and a differential amplification unit for differentiation amplifying the output of the two detection units, and depending on the output of the detection unit or the output of the differential amplification unit, a negative feedback magnetic field is applied to two magnetic detection elements in a period, a predetermined magnetic field is applied to two magnetic detection elements in another period, and a predetermined amendment is made to the output of the differential amplification unit depending on the output of the detection unit or the output of the differential amplification unit of each period.

In another embodiment of the invention, the negative feedback magnetic field applying unit is configured by a negative feedback coil provided near the magnetic detection element and a negative feedback element.

In another embodiment of the invention, in an overload current protective device, which is provided with a switch for supplying a current from a power source to a load or cutting it off, a current detector for detecting the current, and a control power source for providing power to each unit of the device, for cutting off the current to the load when an overcurrent occurs, the current detector includes: two magnetic detection elements which has a magnetic impedance effect and is provided near the wiring leading a current; a current applying unit for applying an alternating current to both ends of the magnetic detection element; a DC bias magnetic field applying unit for applying a DC bias magnetic field to the magnetic detection element; a negative feedback coil for applying a negative feedback magnetic field to the magnetic detection element and a plurality of negative feedback elements; a switch unit for switching the plurality of negative feedback elements; two detection units for detecting the variations in magnetic field by a current from the variations in alternating current varying depending on an external magnetic field applied to the magnetic detection element corresponding to the magnetic detection element; and a differential amplification unit for differentiation amplifying the output of the two detection units, characterized in that, depending on the output of the detection unit or the output of the differential amplification unit, the plurality of negative feedback elements are selected.

In any of the inventions previously discussed, the DC bias magnetic field can be applied by a magnet provided near the magnetic detection element, and in the invention previously discussed, a non-magnetic substrate can be provided with two magnetic detection elements of thin ferromagnet film, and the magnet for applying the DC bias magnetic field and the negative feedback coil for applying the negative feedback magnetic field are formed b ,.y thin film.

In any of the inventions previously discussed, the two magnetic detection elements can be arranged such that they can have equal absolute values of the output to the magnetic flux generated by a current, and have opposite polarity.

BEST MODE FOR CARRYING OUT THE INVENTION

Figure 1:
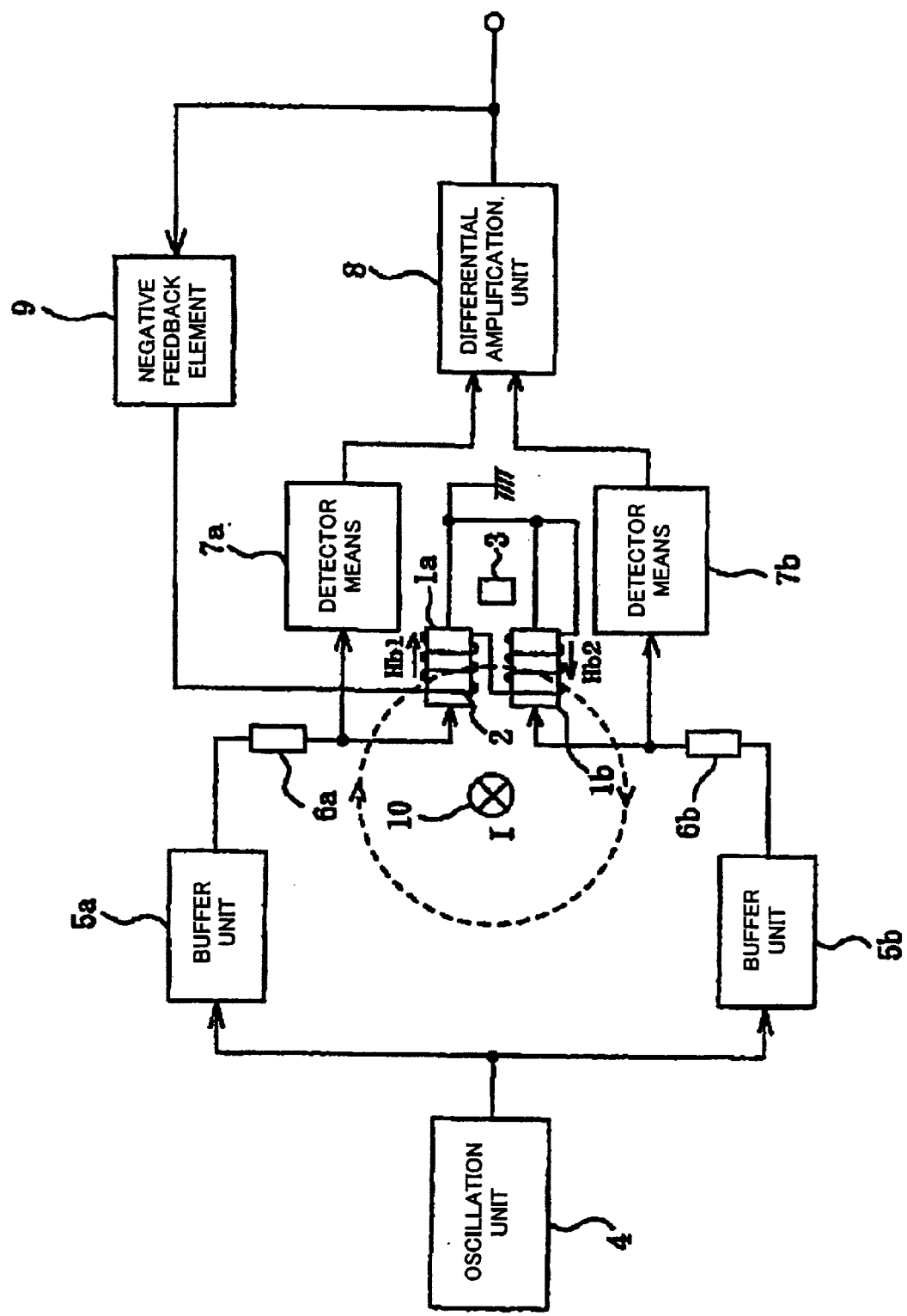
FIG. 1 shows the configuration of the first embodiment of the present invention.

FIG. 1 shows the configuration of the first embodiment of the present invention.

In FIG. 1, magnetic impedance elements (also referred to simply as MI elements) $1a$ and $1b$ can be wire-shaped or thin-film-shaped. A compensation coil 2 applies negative feedback to the MI elements $1a$ and $1b$. A magnet 3 applies a DC bias to the MI elements $1a$ and $1b$. An oscillation unit 4 applies a DC current to the MI elements $1a$ and $1b$. Buffer units $5a$ and $5b$ are inserted depending on the level of the current output by the oscillation unit 4. Reference numerals $6a$ and $6b$ denote resistors. Detector means $7a$ and $7b$ detect the variations in alternating current depending on the external magnetic field applied to the MI elements $1a$ and $1b$. A differential amplification unit 8 amplifies the differential of the output of the detection unit. A negative feedback element 9 supplies a current to the compensation coil 2 depending on the output of the differential amplification unit 8. Wiring 10 leads a detection current.

As shown in FIG. 1, the magnetic impedance elements $1a$ and $1b$ are arranged such that the absolute values of the magnetic flux (Hb1, Hb2) generated by the current I flowing through the wiring 10 can be equal, and the directions of the magnetic flux can be opposite, and the output difference is calculated by the differential amplification unit 8, thereby obtaining the output proportional to the current.

The compensation coil 2 and the negative feedback element 9 apply a magnetic field to the MI elements $1a$ and $1b$ in the direction of decreasing the output of the differential amplification unit 8. The negative feedback element 9 is normally configured by a resistor so that the output sensitivity for the detection current can be reduced proportional to the resistance. Therefore, the measurement precision can be improved by optimizing the value of the negative feedback element 9 depending on the measurement range.

Figure 2:
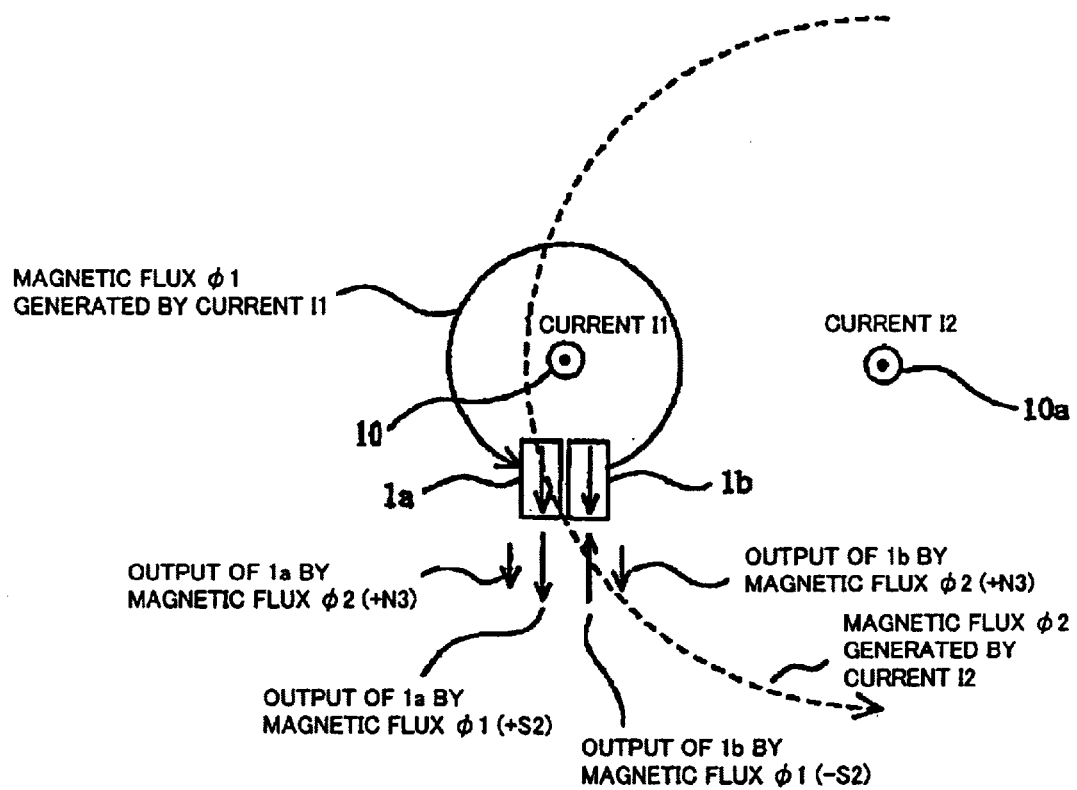
FIG. 2 shows the influence of a current flowing through adjacent wiring.

When the current sensor as shown in 1 is used as the receiving and distributing equipment, it is necessary to eliminate the influence of a current flowing through adjacent wiring. FIG. 2 shows the influence of a current flowing through adjacent wiring. A current I1 flows adjacent to a current I1

The magnetic flux generated by the currents I1 and I2 is respectively defined as $\phi 1$ and $\phi 2$. Using the magnetic flux $\phi 1$ and $\phi 2$, the output of the difference between the two MI elements $1a$ and $1b$ is calculated below.

$$\text{differential output} = \text{output of } 1a - \text{output of } 1b \quad (1)$$
$$= S2 + N3 - (-S2 + N3)$$
$$= 2S2$$

Thus, the current I1 can be detected without the influence of the current I2 flowing through adjacent wiring $10a$.

When a uniform external magnetic field is applied as noise, two MI elements $1a$ and $1b$ indicate output equal in size and sign. Therefore, the influence of noise of the external magnetic field can be removed as in the case of the current flowing through the adjacent wiring.

Figure 3:
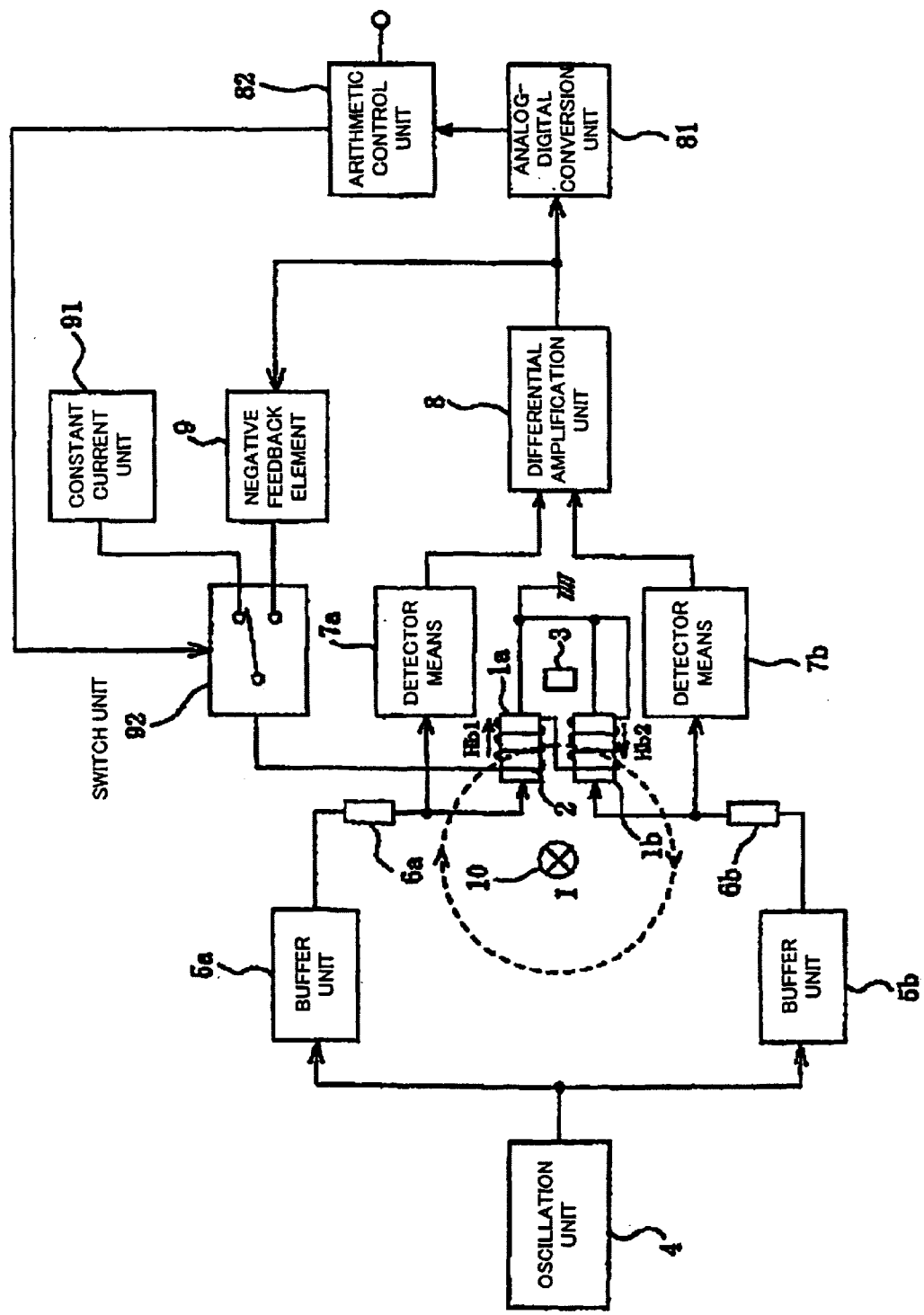
FIG. 3 shows the configuration of the second embodiment of the present invention.

FIG. 3 shows the configuration of the second embodiment of the present invention.

In FIG. 3, a constant current unit 91, a switch unit 92, an analog-digital conversion unit 81, and an arithmetic control unit 82 configured by a microcomputer, etc. are added to the configuration shown in FIG. 1.

With the above-mentioned configuration, a magnetic field is applied to the output of the differential amplification unit 8 using the compensation coil 2 and the negative feedback element 9 in the direction of decreasing the output of the differential amplification unit 8. The arithmetic control unit 82 controls the switch unit 92 to apply a constant current from the constant current unit 91 to the compensation coil 2, and controls the analog-digital conversion unit 81 to detect the output of the differential amplification unit 8. The arithmetic control unit 82 controls the output obtained when a constant current is applied under a predetermined condition to be stored as a reference value, thereby comparing the output of the analog-digital conversion unit 81 with the reference value, correcting the difference from the reference value in the output result, and correcting the output of the apparatus by the environmental characteristic such as a temperature, etc. and a characteristic change with time. As a result, a high-precision and environmental resistant current sensor.

Figure 4:
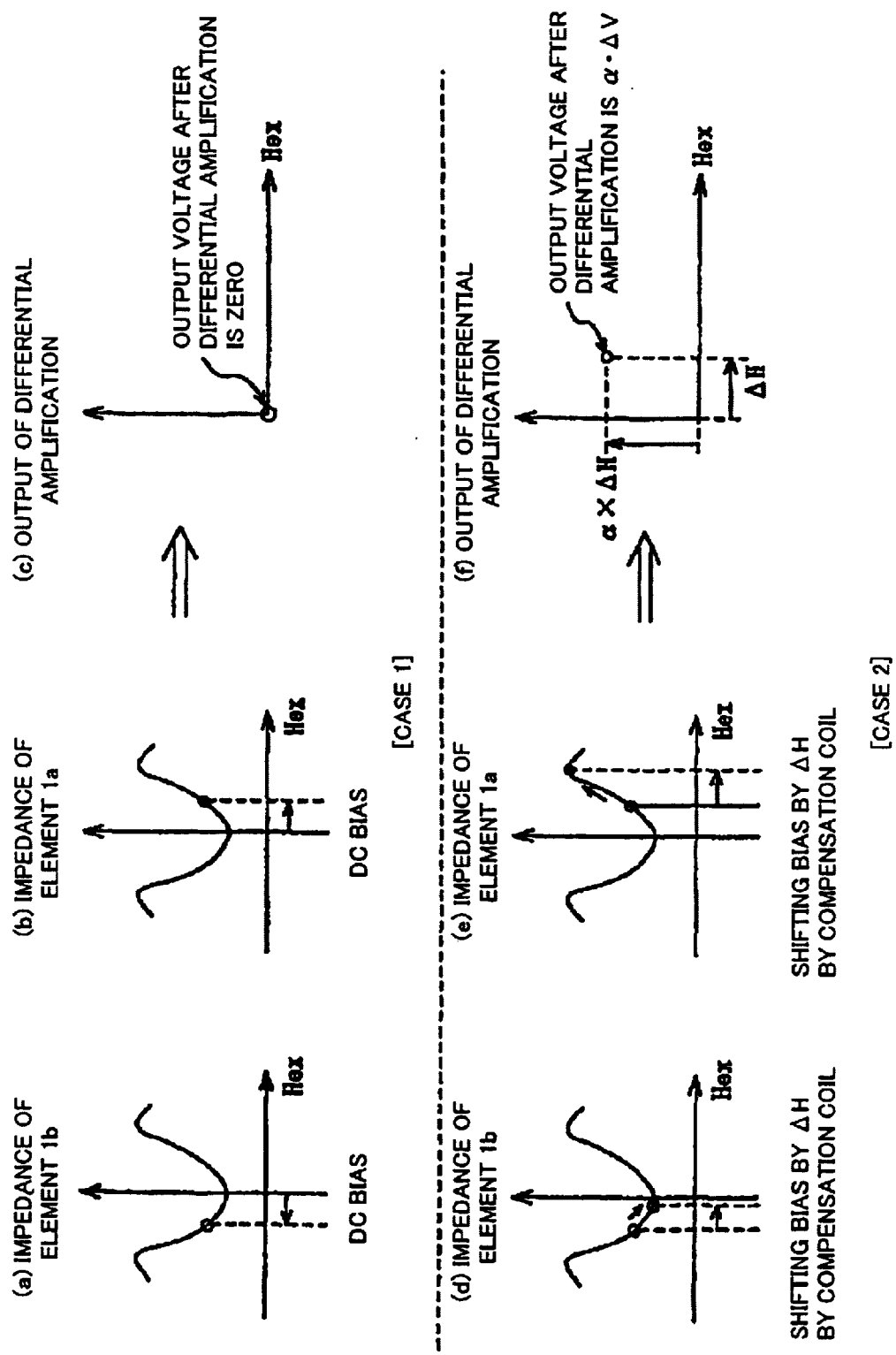
FIG. 4 shows the method for detecting the detection sensitivity in FIG. 3.

FIG. 4 shows the method for detecting the detection sensitivity in FIG. 3.

In FIG. 4, the characteristic of the output of the sensor to an external magnetic field indicates the characteristic of a common magnetic impedance element, and an arbitrary sensor output is obtained regardless of the direction of the magnetic field based on the zero magnetic field.

In the case 1 shown in (a), (b), and (c) in FIG. 4, the median value of the bias magnetic field indicates the zero magnetic field. Therefore, the outputs of the detector means 7a and 7b are equal to each other, and the output of the differential amplification unit 8 is zero.

In the case 2 shown in (d), (e), and (f), the median value of the bias magnetic field is shifted by ΔH, the output difference between the detector means 7a and 7b is ΔV, and the output of the differential amplification unit 8 is α·ΔV (α indicates a gain of the differential amplification unit). ΔV/ΔH is only the sensitivity of the sensor.

Figure 5:
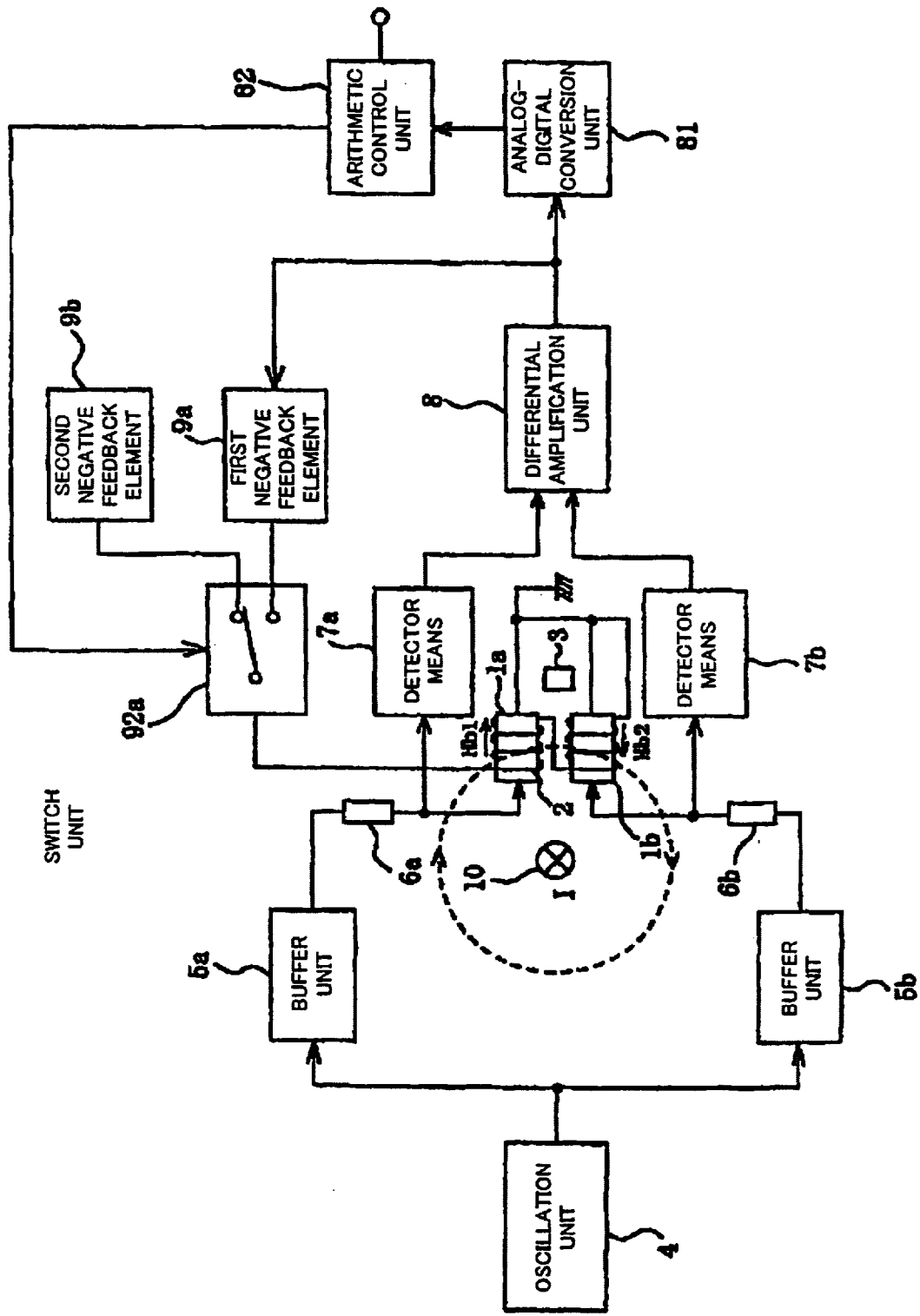
FIG. 5 shows the configuration of the third embodiment of the present invention.

FIG. 5 shows the configuration of the third embodiment of the present invention.

As clearly shown in FIG. 5, the example is characterized by the two negative feedback elements 9a and 9b. In this example, the negative feedback elements 9a and 9b and the compensation coil 2 apply a magnetic field to the MI elements 1a and 1b in the direction of decreasing the output of the differential amplification unit 8 depending on the output of the differential amplification unit 8. Since the negative feedback elements 9a and 9b are normally configured by resistors as describe above, the output sensitivity to the detected current can be decreased proportional to the resistance. Therefore, the values of the negative feedback elements 9a and 9b are set depending on the measurement range, and the switch unit 92 automatically switches the values based on the output of the differential amplification unit 8, thereby obtaining a high-precision current detection characteristic in a wide measurement range.

In FIG. 5, two negative feedback elements are switched, but three or more negative feedback elements can also be switched. In some measurement ranges, no negative feedback can be performed without selecting a negative feedback element.

Figure 6:
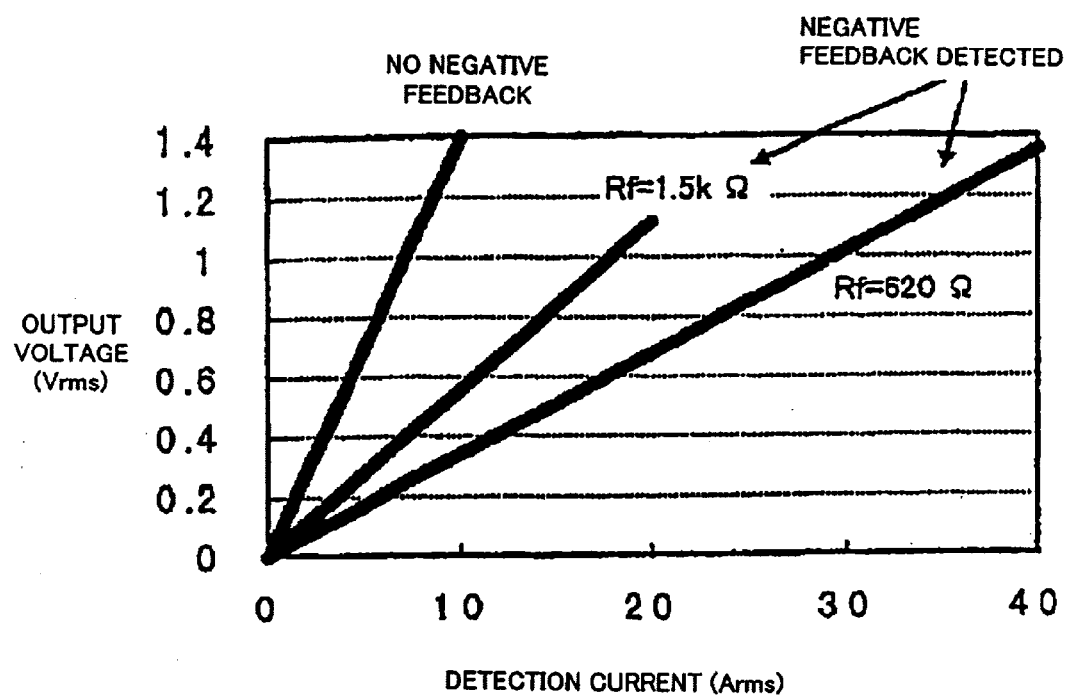
FIG. 6 shows the current detection characteristic with the configuration shown in FIG. 5.

FIG. 6 shows the current detection characteristic according to the third embodiment.

In FIG. 6, two cases, that is, a case in which no negative feedback is carried out, and another case in which a negative feedback is performed using a different resistance, are shown. A wider range is used in the case where a negative feedback element is performed.

Figure 7:
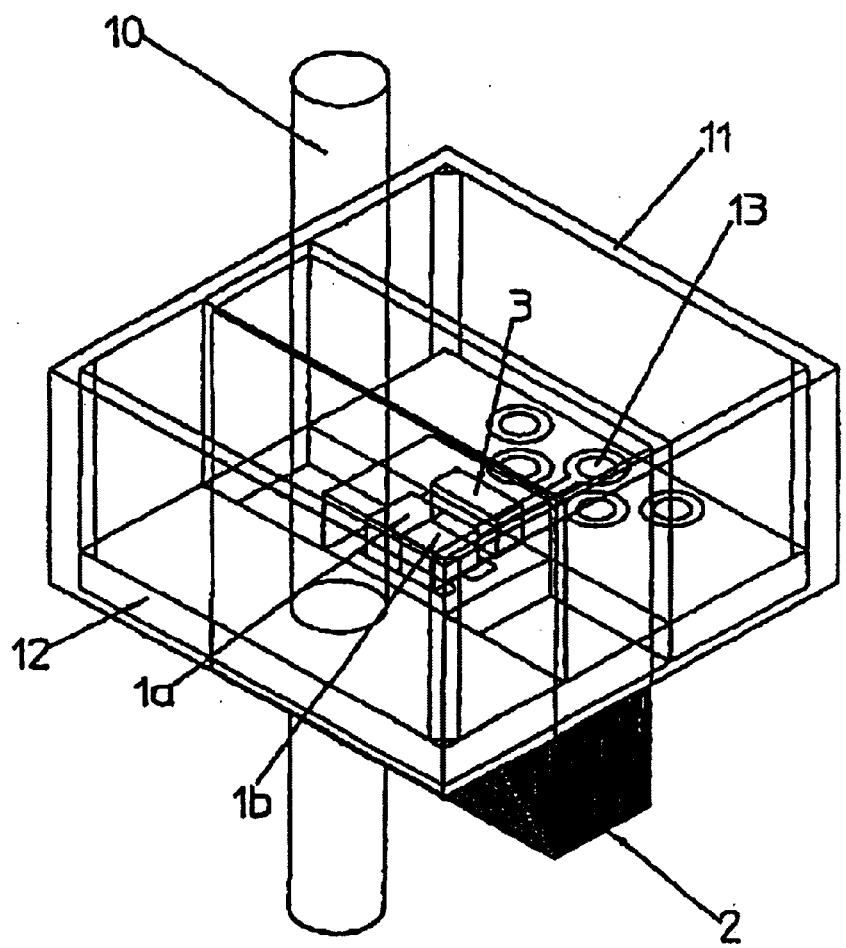
FIG. 7 is an oblique view showing an example of the structure of a wire-type current detection element according to the present invention.

FIG. 7 is an oblique view showing an example of the structure of a wire-type current detection element according to the present invention.

In FIG. 7, the reference numerals 1a and 1b denote MI elements. The compensation coil 2 applies a negative feedback to the MI elements. The magnet 3 applies a DC bias to the MI elements. The wiring 10 leads a detection current. A shield plate 11 cancels the influence of an external magnetic field. A shield plate 11 cancels the influence of an external magnetic field. A through hole 13 retrieves a signal.

Figure 8:
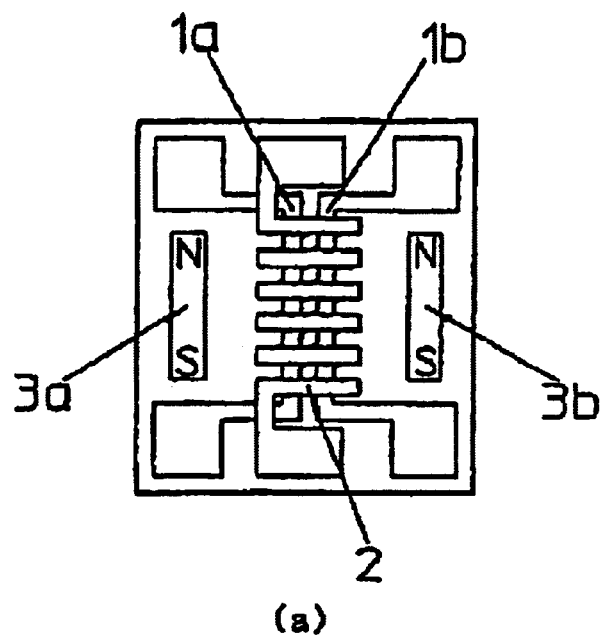
FIG. 8 is an oblique view showing an example of the structure of a thin-film-type current detection element according to the present invention.
Figure 8:
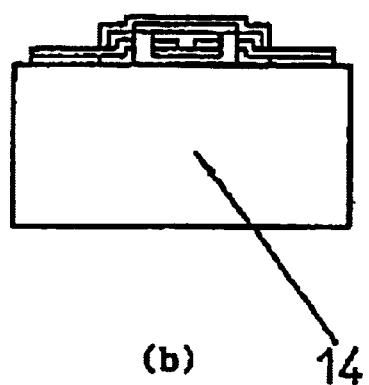

FIG. 8 shows an example of the structure of a thin-film-type current detection element according to the present invention. FIG. 8(a) is a top view, FIG. 8(b) is a sectional view.

In FIG. 8, a substrate 14 shown in (b) is a nonmagnetic substance. The reference numerals 1a and 1b shown in (a) denote the thin-film MI elements. The thin-film compensation coil 2 applies a negative feedback to the MI elements. The MI elements 1a and 1b and the compensation coil 2 are laid on the substrate 14 through an insulator such as nitrogen silicide, etc. Thin-film magnets 3a and 3b apply a DC bias to the MI element. The wide portions on both ends of the MI elements 1a and 1b and the compensation coil 2 are the pads for external wiring. Since the substrate 14 can have dimensions of several millimeters, amazingly small, low-cost, and low power consumption system can be realized.

A system using two magnetic impedance elements is described above, but three or more magnetic impedance elements can be used. Furthermore, the above-mentioned 1-phase current sensor can be obviously replaced with three or more required phases can be applied to the current sensor when it is used for receiving and distributing equipment, etc.

Figure 9:
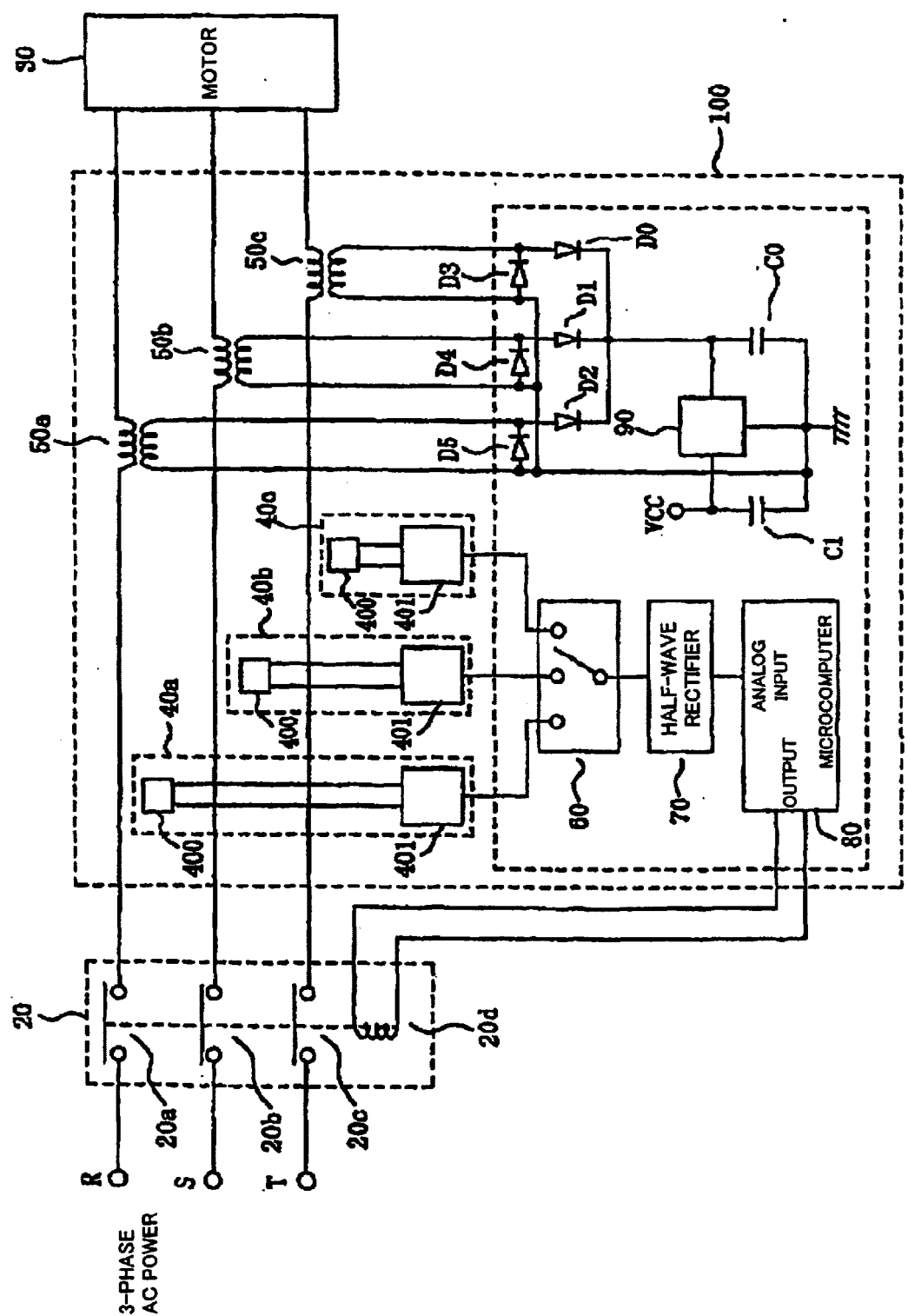
FIG. 9 shows an example of the configuration of the system applied to an overload current protective device.
Figure 10:
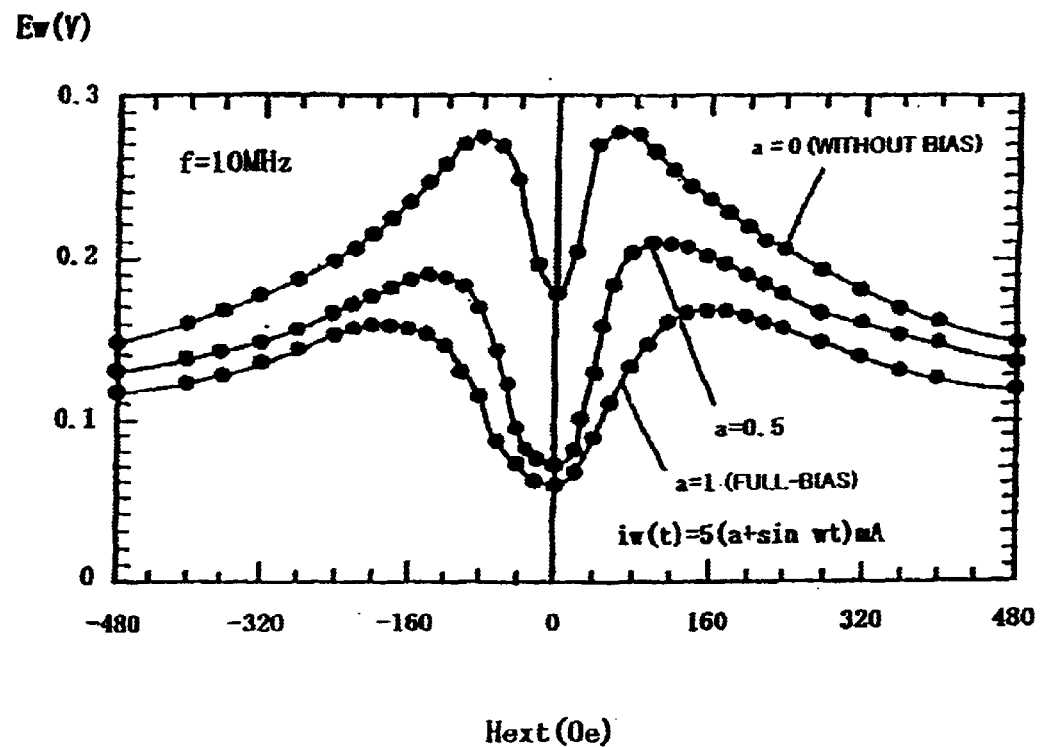
FIG. 10 is a graph showing an example of a magnetic impedance characteristic.
Figure 11:
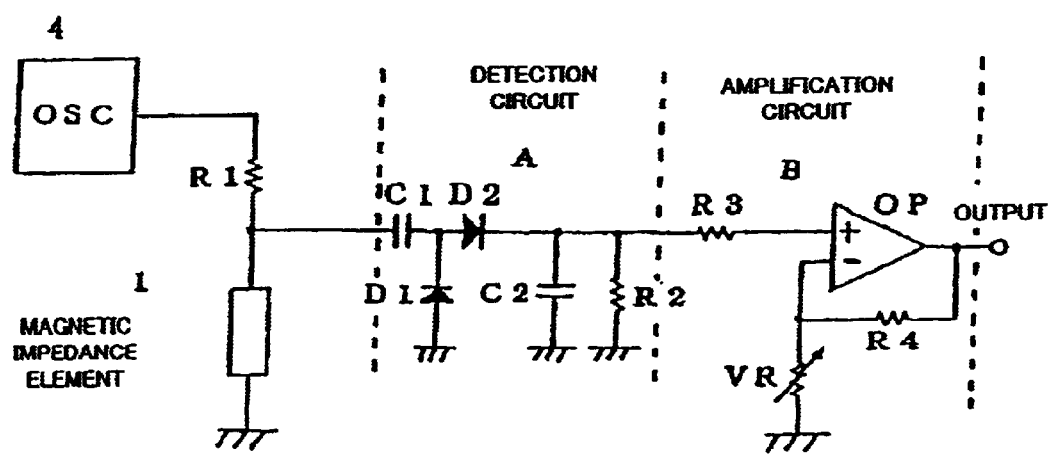
FIG. 11 shows the circuit of the conventional technology.

FIG. 9 shows an example of the overload current protective device to which the above-mentioned current sensor is applied.

The reference characters R, S, and T denote power supply lines connected to a three-phase AC power source, and are connected to a motor 30 through a 3-phase contactor (switch) 20 and three power supply transformers 50a, 50b, and 50c. The current detectors 40a, 40b, and 40c are arranged for each phase between the 3-phase contactor (switch) 20 and the three power supply transformers 50a, 50b, and 50c. The contactor 20 has three contact points 20a, 20b, and 20c are coupled by the different power supply lines R, S, and T to the motor 30 through the primary coils of the power supply transformers 50a, 50b, and 50c respectively. The set of contact points are mechanically coupled to be simultaneously operated by the electromagnetic coil 20d. The electromagnetic coil 20d is connected to the digital output of a microcomputer 80. An electronic overload relay 100 is formed by a control circuit including the microcomputer 80, the current detectors 40a, 40b, and 40c, the power supply transformers 50a, 50b, and 50c, etc.

In this example, the current detectors 40a, 40b, and 40c comprises an MI element 400 having the MI elements 1a and 1b and a drive/detector 401. The output of each unit is sequentially switched by a switch 60. The output of the power supply transformers 50a, 50b, and 50c selected by the switch 60 is connected to the analog input of the microcomputer 80 through a half-wave rectifier 70.

A control power source is connected from the secondary coils of the power supply transformers 50a, 50b, and 50c to a first capacitor C0 through the diodes D0, D1, and D2. The first capacitor C0 is connected between the positive input of a voltage adjuster 90 and the ground, a capacitor C1 is connected between the positive output of the voltage adjuster 90 and the ground, and the voltage Vcc at a predetermined level is provided as a control power source. D3, D4, and D5 are protective diodes.

Industrial Applicability

According to the present invention, the following effects can be expected.

(1) Since the magnetic flux by a current is detected by an MI element having a magnetic impedance effect, the magnetic saturation from a widely and currently used core does not occur. As a result, an apparatus of a wide current detection range can be provided.

(2) When a bias magnetic field and a negative feedback magnetic field are applied to an MI element to improve the linearity, the bias magnetic field is applied from a magnet, and the negative feedback magnetic field is applied from a compensation coil. Therefore, as compared with the conventional configuration in which a bias magnetic field and a negative feedback magnetic field are applied from a coil, a smaller, lower-cost, and lower power consumption apparatus can be realized. Furthermore, by optimizing the value of a negative feedback element depending on the measurement range, the linearity can be improved.

(3) By arranging the two MI elements such that the absolute values of the magnetic flux generated by the detection currents can be equal but in the opposite directions and obtaining the difference between the detection units, the current can be detected without the influence of the disturbance magnetic field or the magnetic field of the current flowing through the adjacent wiring. Therefore, the current sensor of excellent environmental resistance without an influence of noise can be provided.

(4) Since a common magnetic field can be applied to an MI element, and the sensitivity of the magnetic detection element can be automatically detected from the output at that time, an automatic correction can be made although the sensitivity of an element is changed by the environmental characteristic or a change with time. Therefore, an current sensor excellent in environmental resistance and change with time can be provided.

(5) A high-precision current sensor excellent in linearity in a wide measurement range can be provided by setting the resistance of a plurality of negative feedback elements depending on the measurement range, and automatically switching the values based on the output of the differential amplification unit.

(6) A current sensor of high environmental resistance which is not subject to the influence of disturbance noise from the influence of the variance of the sensitivity of a magnetic sensor, a position error, etc. can be provided by including a magnetic shield to cut off an external magnetic field.

(7) Since an MI element, a bias magnet, and a negative feedback coil can be formed by thin film, and a substrate can be configured with the dimensions of several millimeters, an amazingly smaller, lower-cost, and lower power consumption apparatus can be realized. Therefore, a small, mass-producible, and high-precision current sensor can be provided.

(8) When the above-mentioned current sensor is applied to a overload current protective device for controlling a power supply to a load with a current cut off when a current flowing through a conductor is detected and the value of the current exceeds a predetermined threshold, a small, lower-cost, high-current-detection, and high-linearity overload current protective device can be obtained.

What is claimed is:

1. A current sensor, comprising:

two magnetic detection elements which have a magnetic impedance effect and are provided near wiring leading a current;

a current applying unit applying an alternating current to both ends of the magnetic detection elements;

a DC bias magnetic field applying unit applying a DC bias magnetic field to the magnetic detection elements;

two detection units detecting variations in magnetic field by a current from variations in alternating current varying depending on an external magnetic field applied to the magnetic detection element corresponding to the magnetic detection element;

a differential amplification unit differentiation amplifying output of the two detection units; and a negative feedback magnetic field applying unit applying a predetermined negative feedback magnetic field to the magnetic detection element depending on the output of the detection unit or the differential amplification unit.

2. The current sensor according to claim 1, characterized in that the negative feedback magnetic field applying unit is configured by a negative feedback coil provided near the magnetic detection element and a negative feedback element.

3. The current sensor according to claim 1, characterized in that the DC bias magnetic field is applied by a magnet provided near the magnetic detection element.

4. The current sensor according to claim 3, characterized in that a non-magnetic substrate is provided with two magnetic detection elements of thin ferromagnet film, and a magnet for applying the DC bias magnetic field and the negative feedback coil for applying the negative feedback magnetic field are formed by thin film.

5. The current sensor according to claim 1, characterized in that the two magnetic detection elements are arranged such that the elements can have equal absolute values of output to magnetic flux generated by a current, and have opposite polarity.

6. A current sensor, comprising:

two magnetic detection elements which have a magnetic impedance effect and are provided near wiring leading a current;

a current applying unit applying an alternating current to both ends of the magnetic detection elements;

a DC bias magnetic field applying unit applying a DC bias magnetic field to the magnetic detection elements;

a negative feedback magnetic field applying unit applying a negative feedback magnetic field to the magnetic detection elements;

a predetermined magnetic field applying unit applying a predetermined magnetic field to the magnetic detection elements;

a switch unit applying one of the negative feedback magnetic field and the predetermined magnetic field to the magnetic detection elements;

two detection units detecting variations in magnetic field by a current from variations in alternating current varying depending on an external magnetic field applied to the magnetic detection element corresponding to the magnetic detection element; and a differential amplification unit differentiation amplifying output of the two detection units, characterized in that depending on the output of the detection unit or the output of the differential amplification unit, a negative feedback magnetic field is applied to two magnetic detection elements in a period, a predetermined magnetic field is applied to two magnetic detection elements in another period, and a predetermined amendment is made to the output of the differential amplification unit depending on the output of the detection unit or the output of the differential amplification unit of each period.

7. The current sensor according to claim 6, characterized in that the negative feedback magnetic field applying unit is configured by a negative feedback coil provided near the magnetic detection element and a negative feedback element.

8. The current sensor according to claim 6, characterized in that the DC bias magnetic field is applied by a magnet provided near the magnetic detection element.

9. The current sensor according to claim 8, characterized in that a non-magnetic substrate is provided with two magnetic detection elements of thin ferromagnet film, and a magnet for applying the DC bias magnetic field and the negative feedback coil for applying the negative feedback magnetic field are formed by thin film.

10. The current sensor according to claim 6, characterized in that
the two magnetic detection elements are arranged such that the elements can have equal absolute values of output to magnetic flux generated by a current, and have opposite polarity.

11. A current sensor, comprising:
two magnetic detection elements which have a magnetic impedance effect and are provided near wiring leading a current;
a current applying unit applying an alternating current to both ends of the magnetic detection elements;
a DC bias magnetic field applying unit applying a DC bias magnetic field to the magnetic detection elements;
a negative feedback coil applying a negative feedback magnetic field to the magnetic detection elements and a plurality of negative feedback elements;
a switch unit switching the plurality of negative feedback elements;
two detection units detecting variations in magnetic field by a current from variations in alternating current varying depending on an external magnetic field applied to the magnetic detection element corresponding to the magnetic detection element; and
a differential amplification unit differentiation amplifying output of the two detection units, characterized in that
depending on the output of the detection unit or output of the differential amplification unit, the plurality of negative feedback elements are selected.

12. An overload current protective device which is provided with a switch for supplying a current from a power source to a load or cutting it off, a current detector for detecting the current, and a control power source for providing power to each unit of the device, for cutting off the current to a load when an overcurrent occurs, comprising:
two magnetic detection elements which have a magnetic impedance effect and are provided near wiring leading a current;
a current applying unit applying an alternating current to both ends of the magnetic detection elements;
a DC bias magnetic field applying unit applying a DC bias magnetic field to the magnetic detection elements;
two detection units detecting variations in magnetic field by a current from variations in alternating current varying depending on an external magnetic field applied to the magnetic detection element corresponding to the magnetic detection element;
a differential amplification unit differentiation amplifying the output of the two detection units; and
a negative feedback magnetic field applying unit applying a predetermined negative feedback magnetic field to the magnetic detection element depending on output of the detection unit or the differential amplification unit.

13. The overload current protective device according to claim 12, characterized in that
the negative feedback magnetic field applying unit is configured by a negative feedback coil provided near the magnetic detection element and a negative feedback element.

14. The device according to claim 12, characterized in that the DC bias magnetic field is applied by a magnet provided near the magnetic detection element.

15. The device according to claim 14, characterized in that a non-magnetic substrate is provided with two magnetic detection elements of thin ferromagnet film, and a magnet for applying the DC bias magnetic field and a negative feedback coil for applying the negative feedback magnetic field are formed by thin film.

16. The device according to claim 12 characterized in that the two magnetic detection elements are arranged such that the elements can have equal absolute values of output to magnetic flux generated by a current, and have opposite polarity.

17. An overload current protective device, which is provided with a switch for supplying a current from a power source to a load or cutting it off, a current detector for detecting the current, and a control power source for providing power to each unit of the device, for cutting off the current to the load when an overcurrent occurs, comprising:
two magnetic detection elements which have a magnetic impedance effect and are provided near wiring leading a current;
a current applying unit applying an alternating current to both ends of the magnetic detection element;
a DC bias magnetic field applying unit applying a DC bias magnetic field to the magnetic detection elements;
a negative feedback magnetic field applying unit applying a negative feedback magnetic field to the magnetic detection elements;
a predetermined magnetic field applying unit applying a predetermined magnetic field to the magnetic detection elements;
a switch unit applying one of the negative feedback magnetic field and the predetermined magnetic field to the magnetic detection elements;
two detection units detecting variations in magnetic field by a current from the variations in alternating current varying depending on an external magnetic field applied to the magnetic detection element corresponding to the magnetic detection element; and
a differential amplification unit differentiation amplifying output of the two detection units, characterized in that
depending on the output of the detection unit or the output of the differential amplification unit, a negative feedback magnetic field is applied to two magnetic detection elements in a period, a predetermined magnetic field is applied to two magnetic detection elements in another period, and a predetermined amendment is made to the output of the differential amplification unit depending on the output of the detection unit or the output of the differential amplification unit of each period.

18. The overload current protective device according to claim 17, characterized in that
the negative feedback magnetic field applying unit is configured by a negative feedback coil provided near the magnetic detection element and a negative feedback element.

19. The device according to claim 17, characterized in that the DC bias magnetic field is applied by a magnet provided near the magnetic detection element.

20. The device according to claim 19, characterized in that the DC bias magnetic field is applied by a magnet provided near the magnetic detection element.

21. The device according to claim 17, characterized in that the two magnetic detection elements are arranged such that the elements can have equal absolute values of output to magnetic flux generated by a current, and have opposite polarity.

22. An overload current protective device, which is provided with a switch for supplying a current from a power source to a load or cutting it off, a current detector for detecting the current, and a control power source for providing power to each unit of the device, for cutting off the current to the load when an overcurrent occurs, comprising:

two magnetic detection elements which have a magnetic impedance effect and are provided near the wiring leading a current;

a current applying unit applying an alternating current to both ends of the magnetic detection elements;

a DC bias magnetic field applying unit applying a DC bias magnetic field to the magnetic detection elements;

a negative feedback coil applying a negative feedback magnetic field to the magnetic detection elements and a plurality of negative feedback elements;

a switch unit switching the plurality of negative feedback elements;

two detection units detecting variations in magnetic field by a current from variations in alternating current varying depending on an external magnetic field applied to the magnetic detection element corresponding to the magnetic detection element; and a differential amplification unit differentiation amplifying the output of the two detection units, characterized in that, depending on the output of the detection unit or the output of the differential amplification unit, the plurality of negative feedback elements are selected.

* * * * *